United States Patent
Liao

(10) Patent No.: US 7,800,949 B2
(45) Date of Patent: Sep. 21, 2010

(54) MEMORY AND METHOD FOR PROGRAMMING THE SAME

(75) Inventor: Chun-Yu Liao, Taichung (TW)

(73) Assignee: Macronix International Co., Ltd, Hsinchu (TW)

(*) Notice: Subject to any disclaimer, the term of this patent is extended or adjusted under 35 U.S.C. 154(b) by 86 days.

(21) Appl. No.: 12/237,564

(22) Filed: Sep. 25, 2008

(65) Prior Publication Data
US 2010/0074022 A1    Mar. 25, 2010

(51) Int. Cl.
G11C 11/34    (2006.01)
(52) U.S. Cl. ............... 365/185.18; 365/185.24
(58) Field of Classification Search ............ 365/185.18, 365/185.24
See application file for complete search history.

(56) References Cited

U.S. PATENT DOCUMENTS

| | | | | |
|---|---|---|---|---|
| 2007/0159880 A1* | 7/2007 | Eitan | ........................ | 365/184 |
| 2008/0192544 A1* | 8/2008 | Berman et al. | ......... | 365/185.09 |
| 2009/0065841 A1* | 3/2009 | Shappir et al. | ............. | 257/315 |
| 2009/0073760 A1* | 3/2009 | Betser et al. | ............. | 365/185.2 |
| 2009/0073774 A1* | 3/2009 | Horesh et al. | .......... | 365/185.25 |

* cited by examiner

Primary Examiner—Michael T Tran
(74) Attorney, Agent, or Firm—Thomas, Kayden, HOrstemeyer & Risley

(57) ABSTRACT

A method for programming a memory is provided. The memory includes multiple rows of memory cells each including two half cells. The method includes the following steps. Whether the two half cells of a to-be-programmed memory cell of the $n^{th}$ row memory cells are both needed to be programmed or not is determined, wherein n is a positive integer. If the two half cells of the to-be-programmed memory cell are both needed to be programmed, a first initial programming bias voltage corresponding to the $n^{th}$ row memory cells is applied to program the to-be-programmed memory cell. Otherwise, a second initial programming bias voltage corresponding to the $n^{th}$ row memory cells is applied to program the to-be-programmed memory cell. The second initial programming bias voltage is higher than the first initial programming bias voltage.

17 Claims, 4 Drawing Sheets

MEMORY AND METHOD FOR PROGRAMMING THE SAME

BACKGROUND OF THE INVENTION

1. Field of the Invention

The invention relates in general to a memory and a method for programming the same, and more particularly to a method for programming a memory capable of increasing programming speed.

2. Description of the Related Art

Memories are now applied to various data storage. Referring to FIG. 1, a flowchart of a conventional method for programming a memory is shown. The memory includes multiple rows of memory cells each including two half cells. Firstly, in step S100, an initial bias voltage IV1 is applied to program the first row memory cells, and the programming voltage keeps increasing until the first row memory cells all pass programming verification. For example, the initial bias voltage IV1 is 2V, and then is increased step by step.

However, in response to the programming of each half cell, if the programming voltage starts with 2V and gradually increases until the half cell passes programming verification, a longer time is taken and the memory programming speed is slowed down. Thus, in step S110, the difference between the programming voltage at which the memory cell of the first row memory cells first passes programming verification and a constant delta voltage is recorded as an initial bias voltage IV2. Thus, when programming the next row memory cells, the programming voltage does not have to start with 2V and can start with the initial bias voltage IV2 that is higher than the initial bias voltage IV1 and increase afterwards, hence saving a large amount of programming time.

Then, in step S120, an initial bias voltage IVn is applied as the programming voltage to program the $n^{th}$ row memory cells, the programming voltage keeps increasing until the $n^{th}$ row memory cells all pass programming verification, and the difference between the programming voltage at which the memory cell of the $n^{th}$ row memory cells first passes programming verification and the constant delta voltage is recorded as an initial bias voltage IVn+1, wherein n is a positive integer greater than 1. Afterwards, in step S130, the initial bias voltage IVn+1 is applied as the programming voltage to program the $(n+1)^{th}$ row memory cells, and the programming voltage keeps increasing until the $(n+1)^{th}$ row memory cells all pass programming verification.

However, two half cells in a single memory cell may interact with each other. For example, after the left half cell is programmed, the charge captured in the left side of the memory cell will increase such that the current in the channel decreases. However, the current will also be decreased when the right half cell is read due to the second bit effect. That is, less hot electrons are needed to generate the same threshold voltage when programming the second bit (left half cell and right half cell are the second bit of each other) in a single memory cell. Due to the second bit effect, the programming voltage may be lower when both half cells are needed to be programmed. The learning programming bias voltage may always be lower than the programming voltage of the memory cell first passing programming verification. If only an initial bias voltage from previous row is applied, it may need more programming pulses to pass the programming verify for the memory cells that only has a half cell needed to be programmed, hence wasting programming time and resulting the memory programming speed be slowed down.

SUMMARY OF THE INVENTION

The invention is directed to a memory and a method for programming the same. According to whether the two half cells of the to-be-programmed memory cell are both needed to be programmed or not, one of two different initial programming bias voltage is applied to program the to-be-programmed memory cell, such that memory programming speed is increased and memory programming time is shortened.

According to a first aspect of the present invention, a method for programming a memory is provided. The memory includes multiple rows of memory cells each including two half cells. The method includes the following steps. Whether the two half cells of a to-be-programmed memory cell of the $n^{th}$ row memory cells are both needed to be programmed or not is determined, wherein n is a positive integer. If the two half cells of the to-be-programmed memory cell are both needed to be programmed, a first initial programming bias voltage corresponding to the $n^{th}$ row memory cells is applied to program the to-be-programmed memory cell. Otherwise, a second initial programming bias voltage corresponding to the $n^{th}$ row memory cells is applied to program the to-be-programmed memory cell. The second initial programming bias voltage is higher than the first initial programming bias voltage.

According to a second aspect of the present invention, a memory is provided. The memory includes multiple rows of memory cells and a control circuit. Each including two half cells. The control circuit is coupled to the memory cells and determines whether the two half cells of a to-be-programmed memory cell of the $n^{th}$ row memory cells are both needed to be programmed or not, wherein n is a positive integer. The control circuit applies a first initial programming bias voltage corresponding to the $n^{th}$ row memory cells to program the to-be-programmed memory cell if the two half cells of the to-be-programmed memory cell are both needed to be programmed, otherwise the control circuit applies a second initial programming bias voltage corresponding to the $n^{th}$ row memory cells to program the to-be-programmed memory cell, and the second initial programming bias voltage is higher than the first initial programming bias voltage.

The invention will become apparent from the following detailed description of the preferred but non-limiting embodiments. The following description is made with reference to the accompanying drawings.

DETAILED DESCRIPTION OF THE INVENTION

The invention provides a memory and a method for programming the same. In response to whether the two half cells of a single to-be-programmed memory cell are both needed to be programmed or not, one of two different initial programming bias voltages are applied to program the to-be-programmed memory cell, such that memory programming speed is increased and memory programming time is shortened.

Figure 1:
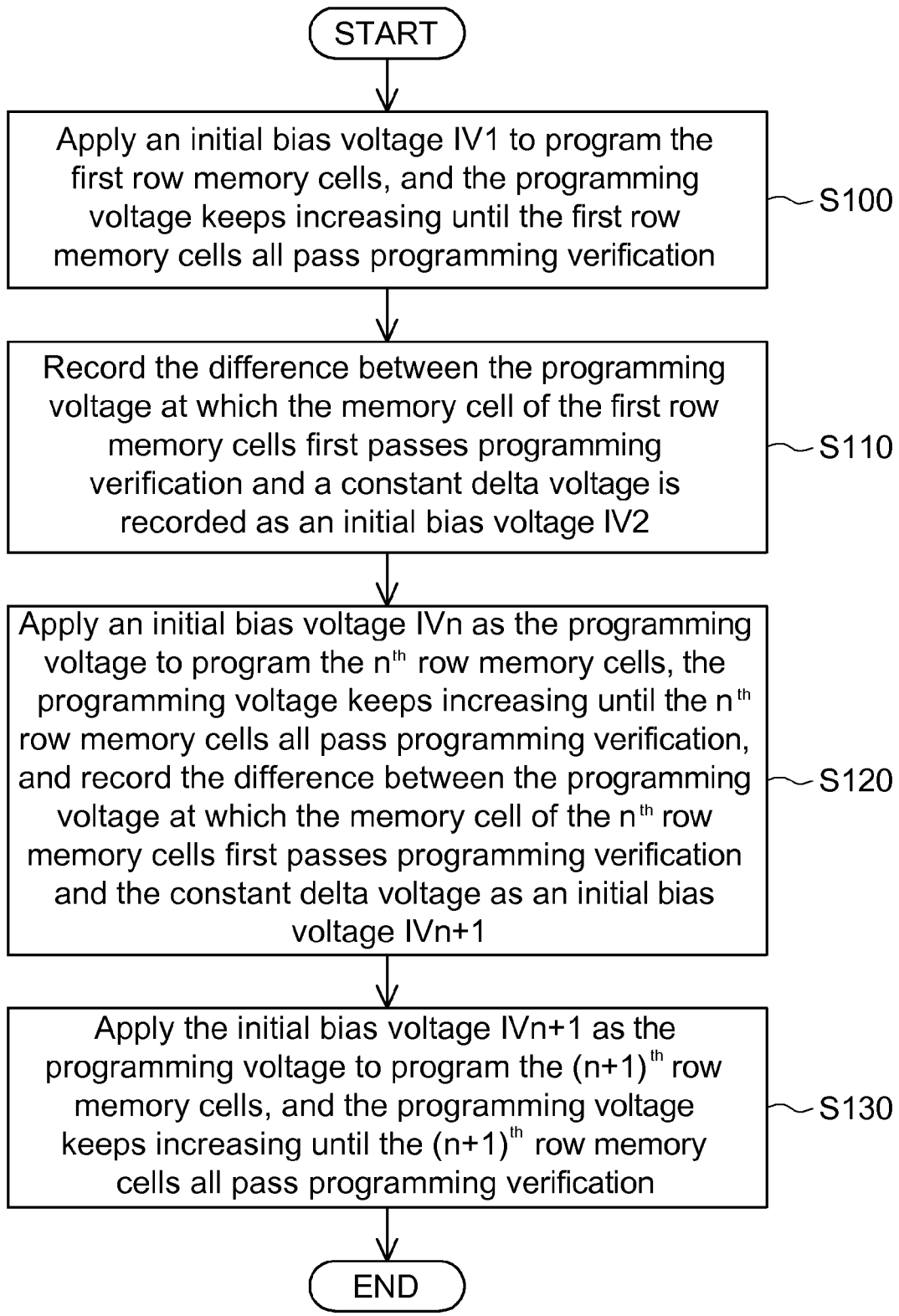
FIG. 1 is a flowchart of a conventional method for programming a memory.
Figure 2:
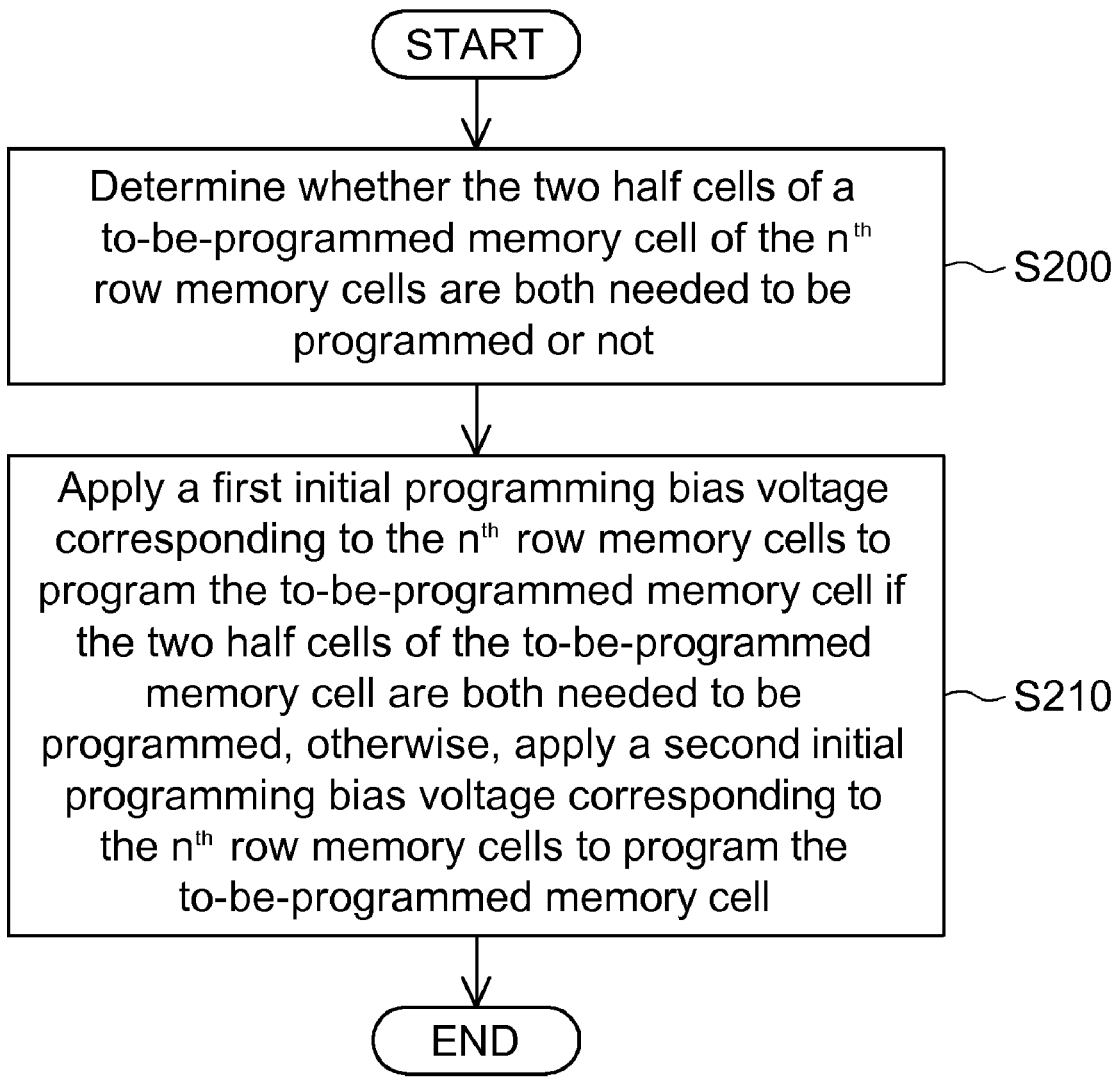
FIG. 2 is a flowchart of a method for programming a memory according to a preferred embodiment of the invention.
Figure 3A:
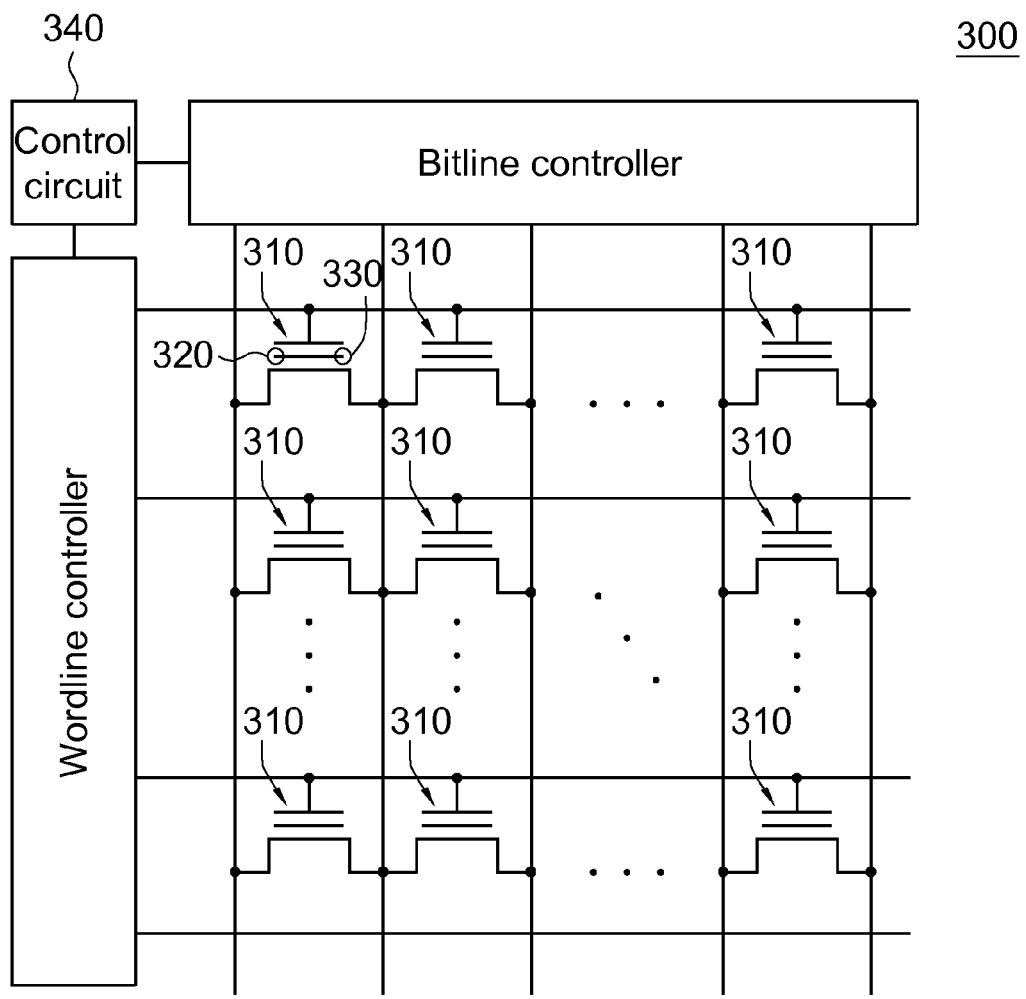
FIG. 3A is a schematic illustration showing a memory according to a preferred embodiment of the invention.

Referring to FIG. 2, a flowchart of a method for programming a memory according to a preferred embodiment of the invention is shown. The memory is a charge trapped memory, for example. Referring to FIG. 3A, a schematic illustration showing a memory according to a preferred embodiment of the invention is shown. The memory 300 includes multiple rows of memory cells 310 and a control circuit 340. Each memory cell 310 includes two half cells 320 and 330.

The method for programming a memory includes the following steps. In step S200, whether the two half cells of a to-be-programmed memory cell of the $n^{th}$ row memory cells are both needed to be programmed or not is determined by control circuit from input data of row, wherein n is a positive integer. In step S210, if the two half cells of the to-be-programmed memory cell are both needed to be programmed, a first initial programming bias voltage corresponding to the $n^{th}$ row memory cells is applied to program the to-be-programmed memory cell by the control circuit 340. Otherwise, a second initial programming bias voltage corresponding to the $n^{th}$ row memory cells is applied to program the to-be-programmed memory cell by the control circuit 340. The second initial programming bias voltage is higher than the first initial programming bias voltage. Wherein the first initial programming bias voltage or the second initial programming bias voltage is applied to a drain of the to-be-programmed memory cell or a word line corresponding to the to-be-programmed memory cell.

In addition, if the two half cells of the to-be-programmed memory cell are both needed to be programmed and the to-be-programmed memory cell is the memory cell first passing programming verification in the $n^{th}$ row memory cells, the difference between the programming voltage at which the to-be-programmed memory cell passes programming verification and a constant delta voltage is recorded as a first initial programming bias voltage corresponding to the $(n+1)^{th}$ row memory cells. Furthermore, the difference may be used as a first initial programming bias voltage corresponding to the $(n+2)^{th}$ row memory cells, and is not limited thereto. The constant delta voltage is substantially 0.3 Volts as exemplified.

In addition, if only one of the two half cells of the to-be-programmed memory cell is needed to be programmed and the to-be-programmed memory cell is the memory cell first passing programming verification in the $n^{th}$ row memory cells, the difference between the programming voltage at which the to-be-programmed memory cell passes programming verification and the constant delta voltage is recorded as a second initial programming bias voltage corresponding to the $(n+1)^{th}$ row memory cells. Furthermore, the difference may be used as a second initial programming bias voltage corresponding to the $(n+2)^{th}$ row memory cells, and is not limited thereto.

Figure 3B:
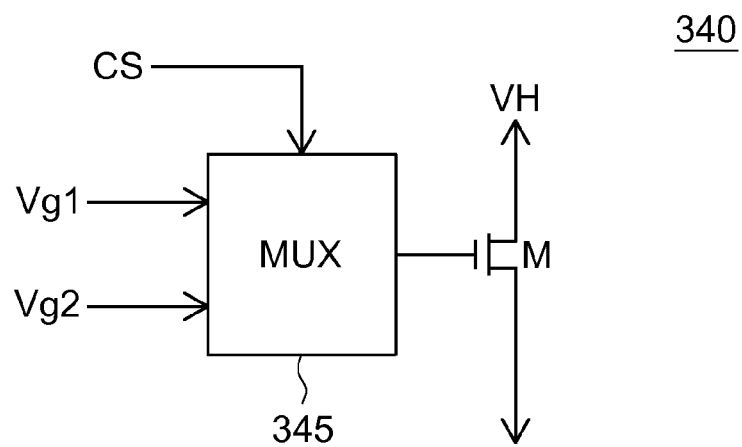
FIG. 3B is a circuit diagram of an example of a control circuit of a memory according to a preferred embodiment of the invention.

Referring to FIG. 3B, a circuit diagram of an example of a control circuit of a memory according to a preferred embodiment of the invention is shown. The control circuit 340 includes at least one transistor M and at least one multiplexer 345. The at least one transistor M is substantially a MOSFET.

The first terminal of the transistor M receives a high voltage VH, and the second terminal of the transistor M is coupled to the drain of the to-be-programmed memory cell or the word line corresponding to the to-be-programmed memory cell. The multiplexer 345 is couled to the control terminal of the transistor M and controlled by a control signal CS. The control signal CS is substantially corresponding to whether the two half cells of the to-be-programmed memory cell are both needed to be programmed or not. Consequently, the multiplexer 345 outputs different bias voltages Vg1 or Vg2 to the control terminal of the transistor M, such that the transistor M applies the first initial programming bias voltage or the second initial programming bias voltage to the to-be-programmed memory cell. In addition, the control circuit 340 may be integrated into a bitline controller or a wordline controller of the memory 300, and it is not limited.

Figure 4:
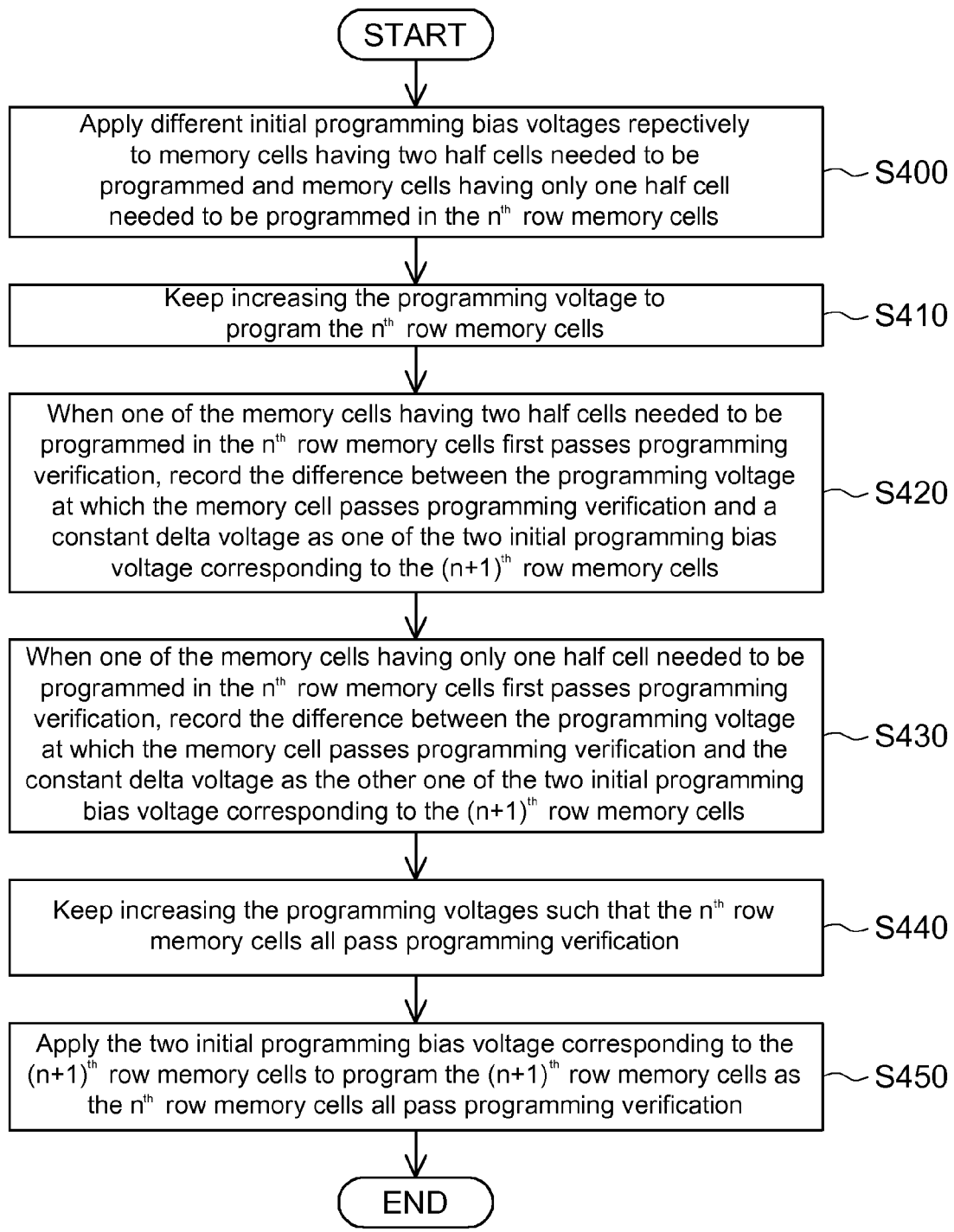
FIG. 4 is a detailed flowchart of a method for programming a memory according to a preferred embodiment of the invention.

Referring to FIG. 4, a detailed flowchart of a method for programming a memory according to a preferred embodiment of the invention is shown. In step S400, different initial programming bias voltages are respectively applied to memory cells having two half cells needed to be programmed and memory cells having only one half cell needed to be programmed in the $n^{th}$ row memory cells. Wherein a higher initial programming bias voltage is applied to the memory cells having only one half cell needed to be programmed, hence reducing programming pulses and saving the programming time. In step S410, the programming voltage keeps increasing to program the $n^{th}$ row memory cells.

In step S420, when one of the memory cells having two half cells needed to be programmed in the $n^{th}$ row memory cells first passes programming verification, the difference between the programming voltage at which the memory cell passes programming verification and a constant delta voltage is recorded as one of the two initial programming bias voltage corresponding to the $(n+1)^{th}$ row memory cells.

In step S430, when one of the memory cells having only one half cell needed to be programmed in the $n^{th}$ row memory cells first passes programming verification, the difference between the programming voltage at which the memory cell passes programming verification and the constant delta voltage is recorded as the other one of the two initial programming bias voltage corresponding to the $(n+1)^{th}$ row memory cells. In step S440, the programming voltages keeps increasing such that the $n^{th}$ row memory cells all pass programming verification. In step S450, the two initial programming bias voltage corresponding to the $(n+1)^{th}$ row memory cells are applied to program the $(n+1)^{th}$ row memory cells as the $n^{th}$ row memory cells all pass programming verification.

According to the method for programming a memory disclosed in the above embodiment of the invention, one of different initial programming bias voltages are applied to program a to-be-programmed memory cell in response to whether the two half cells of the single to-be-programmed cell are both needed to be programmed or not. Thus, instead of increasing the programming voltage from 2V, the programming voltage starts from the difference between the programming voltage at which the memory cell first passes programming verification in the $n^{th}$ row memory cells and the constant delta voltage, so that the memory programming speed is increased and the memory programming time is shortened. Besides, the method for programming a memory further preferably programs the next row memory cells according to a first initial programming bias voltage and a second initial programming bias voltage recorded in the programming process of a single row of memory cells.

While the invention has been described by way of example and in terms of a preferred embodiment, it needs to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for programming a memory, which comprises a plurality of rows of memory cells each comprising two half cells, the method comprising the steps of:
   determining whether the two half cells of a to-be-programmed memory cell of the $n^{th}$ row memory cells are both needed to be programmed or not, wherein n is a positive integer; and
   applying a first initial programming bias voltage corresponding to the $n^{th}$ row memory cells to program the to-be-programmed memory cell if the two half cells of the to-be-programmed memory cell are both needed to be programmed, otherwise applying a second initial programming bias voltage corresponding to the $n^{th}$ row memory cells to program the to-be-programmed memory cell, and the second initial programming bias voltage is higher than the first initial programming bias voltage.

2. The method for programming a memory according to claim 1, wherein the memory is a charge trapped memory.

3. The method for programming a memory according to claim 1, wherein the first initial programming bias voltage or the second initial programming bias voltage is applied to a drain of the to-be-programmed memory cell.

4. The method for programming a memory according to claim 1, wherein the first initial programming bias voltage or the second initial programming bias voltage is applied to a word line corresponding to the to-be-programmed memory cell.

5. The method for programming a memory according to claim 1, further comprising:
   recording a difference between a programming voltage at which the to-be-programmed memory cell passes programming verification and a constant delta) voltage as a first initial programming bias voltage corresponding to the $(n+1)^{th}$ row memory cells if the two half cells of the to-be-programmed memory cell are both needed to be programmed and the to-be-programmed memory cell is the memory cell first passing programming verification in the $n^{th}$ row memory cells.

6. The method for programming a memory according to claim 5, wherein the first initial programming bias voltage corresponding to the $(n+1)^{th}$ row memory cells is also used as a first initial programming bias voltage corresponding to the $(n+2)^{th}$ row memory cells.

7. The method for programming a memory according to claim 1, further comprising:
   recording a difference between the programming voltage at which the to-be-programmed memory cell passes programming verification and a constant delta) voltage as a second initial programming bias voltage corresponding to the $(n+1)^{th}$ row memory cells if only one of the two half cells of the to-be-programmed memory cell is needed to be programmed and the to-be-programmed memory cell is the memory cell first passing programming verification in the $n^{th}$ row memory cells.

8. The method for programming a memory according to claim 7, wherein the second initial programming bias voltage corresponding to the $(n+1)^{th}$ row memory cells is also used as a second initial programming bias voltage corresponding to the $(n+2)^{th}$ row memory cells.

9. A memory, comprising:
   a plurality of rows of memory cells, each comprising two half cells; and
   a control circuit, coupled to the memory cells and for determining whether the two half cells of a to-be-programmed memory cell of the $n^{th}$ row memory cells are both needed to be programmed or not, wherein n is a positive integer;
   wherein the control circuit applies a first initial programming bias voltage corresponding to the $n^{th}$ row memory cells to program the to-be-programmed memory cell if the two half cells of the to-be-programmed memory cell are both needed to be programmed, otherwise the control circuit applies a second initial programming bias voltage corresponding to the $n^{th}$ row memory cells to program the to-be-programmed memory cell, and the second initial programming bias voltage is higher than the first initial programming bias voltage.

10. The memory according to claim 9 is a charge trapped memory.

11. The memory according to claim 9, wherein the control circuit applies the first initial programming bias voltage or the second initial programming bias voltage to a drain of the to-be-programmed memory cell.

12. The memory according to claim 9, wherein the control circuit applies the first initial programming bias voltage or the second initial programming bias voltage to a word line corresponding to the to-be-programmed memory cell.

13. The memory according to claim 9, wherein the control circuit records a difference between the programming voltage at which the to-be-programmed memory cell passes programming verification and a constant delta voltage as a first initial programming bias voltage corresponding to the $(n+1)^{th}$ row memory cells if the two half cells of the to-be-programmed memory cell are both needed to be programmed and the to-be-programmed memory cell is the memory cell first passing programming verification in the $n^{th}$ row memory cells.

14. The memory according to claim 13, wherein the first initial programming bias voltage corresponding to the $(n+1)^{th}$ row memory cells is also used as a first initial programming bias voltage corresponding to the $(n+2)^{th}$ row memory cells.

15. The memory according to claim 9, wherein the control circuit records a difference between the programming voltage at which the to-be-programmed memory cell passes programming verification and a constant delta voltage as a second initial programming bias voltage corresponding to the $(n+1)^{th}$ row memory cells if only one of the two half cells of the to-be-programmed memory cell is needed to be programmed and the to-be-programmed memory cell is the memory cell first passing programming verification in the $n^{th}$ row memory cells.

16. The memory according to claim 15, wherein the second initial programming bias voltage corresponding to the $(n+1)^{th}$ row memory cells is also used as a second initial programming bias voltage corresponding to the $(n+2)^{th}$ row memory cells.

17. The memory according to claim 9, wherein the control circuit comprises:
   at least one transistor, coupled to the to-be-programmed memory cell; and
   at least one multiplexer, coupled to the at least one transistor and controlled by a control signal, such that the at least one transistor applies the first initial programming bias voltage or the second initial programming bias voltage to the to-be-programmed memory cell.

* * * * *